United States Patent [19]
Smith

[11] Patent Number: 6,025,792
[45] Date of Patent: Feb. 15, 2000

[54] ANALOG COMPENSATION CIRCUITRY FOR INTEGRATED CIRCUIT INPUT/OUTPUT CIRCUITRY

[75] Inventor: Jeffrey E. Smith, Aloha, Oreg.

[73] Assignee: Intel Corporation, Santa Clara, Calif.

[21] Appl. No.: 09/012,478

[22] Filed: Jan. 23, 1998

[51] Int. Cl.[7] .................................................. H03M 1/12
[52] U.S. Cl. ........................................................ 341/155
[58] Field of Search .................................... 341/155, 118, 341/120, 126

[56] References Cited

U.S. PATENT DOCUMENTS 4,594,558   6/1986   Congdon ...................................... 330/9

*Primary Examiner*—Brian Young
*Attorney, Agent, or Firm*—Blakely, Sokoloff, Taylor & Zafman LLP

[57] ABSTRACT

An analog compensation circuit for providing process/voltage/temperature (PVT) bias compensation signals for input/output (I/O) circuitry within an integrated circuit includes a first current source coupled to a first node. A first load coupled to the first current source and a second node provides a first reference voltage. A voltage divider coupled between the first and second nodes provides a current source bias voltage to the first current source. A differential amplifier generates a first bias compensation signal as feedback for the first current source in accordance with the difference between the first reference voltage and a second reference voltage. With the addition of logic level bias converters, the compensation circuitry is capable of providing bias compensation signals to multiple logic families. The bias compensation signals can be applied to current sources used to control the functioning of integrated circuit I/O circuitry so that the I/O circuitry operates substantially independently of PVT variations.

26 Claims, 8 Drawing Sheets

6,025,792

ANALOG COMPENSATION CIRCUITRY FOR INTEGRATED CIRCUIT INPUT/OUTPUT CIRCUITRY

FIELD OF THE INVENTION

This invention relates to the field of integrated circuits. In particular, this invention is drawn to analog compensation for integrated circuit input/output circuitry.

BACKGROUND OF THE INVENTION

Changes in input/output (I/O) timing parameters can severely impact I/O performance, particularly with respect to high performance or high frequency I/O design. Typically, an I/O circuit (e.g., a buffer) is designed for operation within strict timing guidelines. Failure to operate with the intended timing parameters may prevent the buffer from operating properly. Alternatively, failure to operate within these timing parameters may prevent the buffer from interfacing properly with other circuitry that does adhere to the timing parameters.

Variations in temperature may cause the buffer circuitry to operate outside of the intended timing parameters. Process variations introduced during manufacture of the buffer circuitry can cause variations that detract from optimal performance even if the buffer circuitry is still operating within intended timing parameters.

The buffer circuitry is typically designed to operate at specific voltages or within specified voltage ranges. In practice, however, the voltages are typically within some tolerance factor of the specified voltage or range. Changes in voltage, however, tend to cause a shift in the actual timing parameters of the buffer circuitry.

Alternatively, the collective effect of process, voltage, and temperature (PVT) variations may prevent the buffer from functioning or prevent the buffer from performing in accordance with the intended timing parameters. Lack of adequate compensation for individual I/O components can result in departure from optimal performance if, for example, the timing parameters change.

Some I/O circuitry must translate one type of logic to another type of logic. For example, an integrated circuit may have Gunning Transceiver Logic (GTL) based I/O buffers with a complementary metal oxide semiconductor (CMOS) logic based core. The I/O circuitry must be able to translate between GTL and CMOS levels in order to properly function. PVT variations within the GTL circuitry or the CMOS circuitry separately or collectively can produce timing parameter changes that prevent the I/O circuitry from operating at optimal performance levels.

SUMMARY OF THE INVENTION

In view of limitations of known systems and methods an analog compensation circuit for providing process/voltage/temperature (PVT) bias compensation signals to input/output (I/O) circuitry within an integrated circuit is provided. The analog compensation circuit includes a first current source coupled to a first node. A first load coupled to the first current source and a second node provides a first reference voltage. A voltage divider coupled between the first and second nodes provides a current source bias voltage to the first current source. A differential amplifier generates a first bias compensation signal as feedback for the first current source in accordance with the difference between the first reference voltage and a second reference voltage. The analog compensation circuit is capable of generating bias compensation signals for multiple logic families with the addition of logic level bias converters. The bias compensation signals can be applied to current sources used to control the functioning of I/O circuitry so that the integrated circuit I/O circuitry operates substantially independently of PVT variations.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
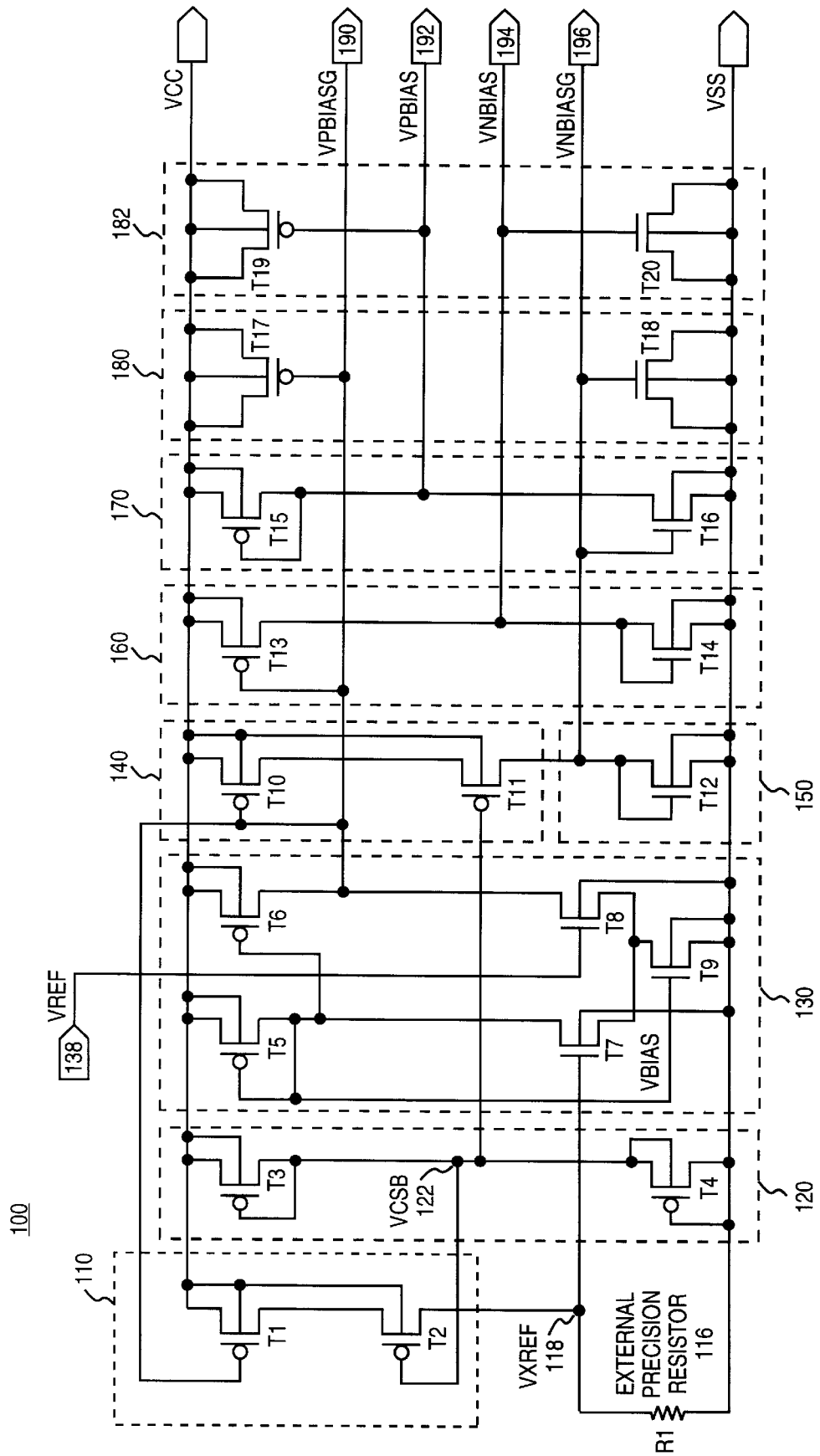
FIG. 1 illustrates analog compensation circuitry for providing PVT bias compensation signals to integrated circuit I/O circuitry.

FIG. 1 illustrates an analog compensation circuit for providing process/voltage/temperature (PVT) bias compensation signals to multiple types of logic within an integrated circuit. In the illustrated embodiment, analog compensation circuit 100 provides PVT bias compensation signals for Gunning Transceiver Logic (GTL) and complementary metal oxide semiconductor (CMOS) logic.

Referring to FIG. 1, compensation circuitry 100 can be divided into individual modules for analysis. The compensation circuitry includes a first current source 110, a voltage divider 120, a differential amplifier 130, and a second current source 140. In one embodiment, the compensation circuitry includes logic level converters 160 and 170 to produce PVT bias compensation signals for a second type of logic from the bias compensation signals generated for a first type of logic. In one embodiment, the first type of logic is GTL and the second type of logic is CMOS logic. Finally, compensation circuitry 100 includes capacitive elements T17, T18, T19, and T20 to reduce the effect of noise on the compensation circuitry, to reduce the noise in the generated bias compensation signals themselves, and to correlate the output noise with noise already present in the power supply.

Figure 2:
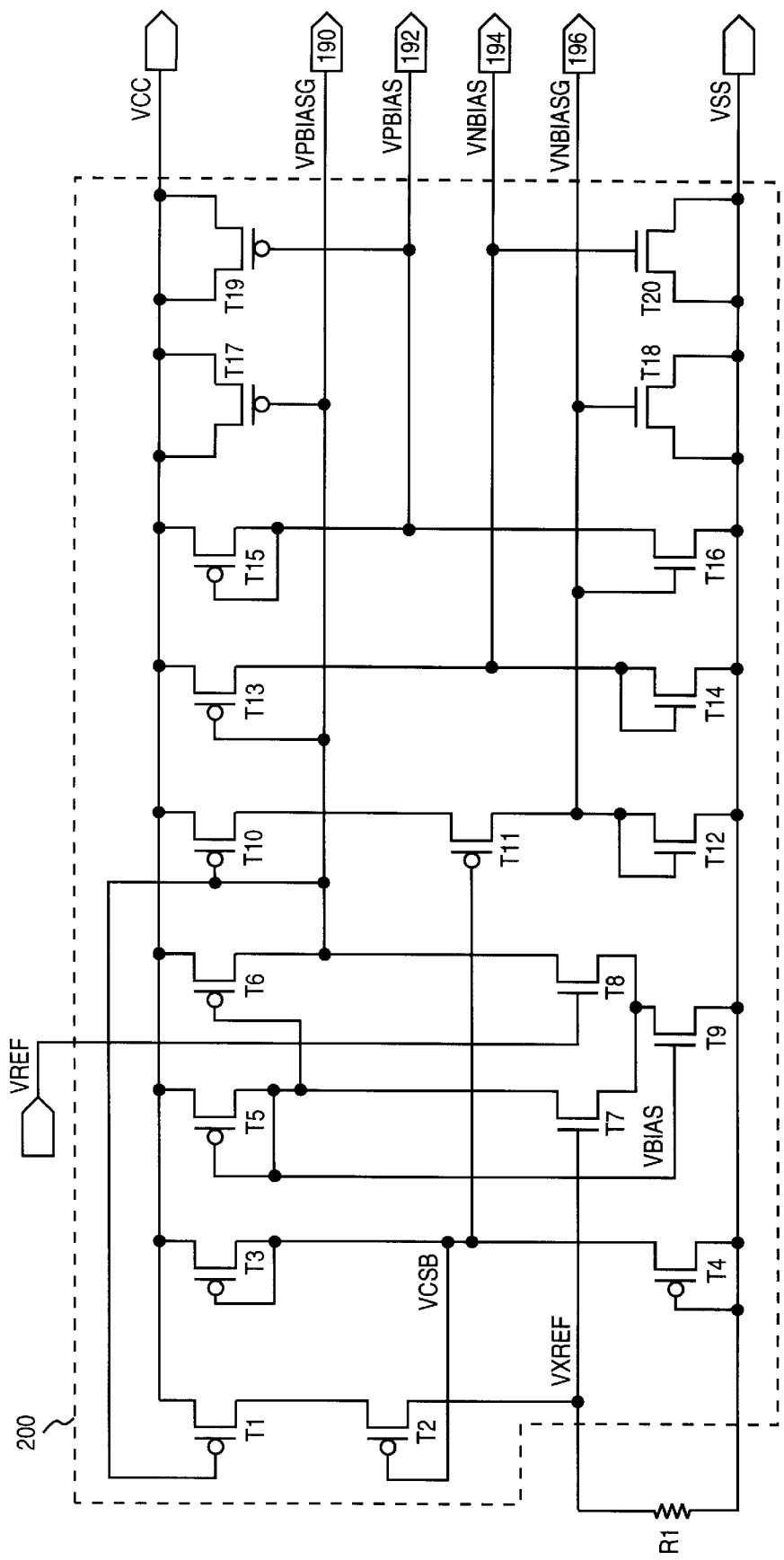
FIG. 2 illustrates a simplified view of the analog compensation circuitry of FIG. 1.

FIG. 2 illustrates another view of analog compensation circuit 100 as analog compensation circuit 200. With respect to FIG. 2, the transistor substrate connections and many of the FIG. 1 reference characters have been eliminated from the illustration in order to more clearly present the analog compensation circuitry.

Referring to FIG. 1 for analysis, transistors T1 and T2 form the first current source 110. The first current source is coupled to a precision resistor 116 in order to produce a first reference voltage 118. In one embodiment, the compensation circuitry excluding the precision resistor 116 resides within an integrated circuit. The precision resistor is an external component that can be connected to the first current source 110 using a pin of the integrated circuit.

Transistors T3 and T4 form voltage divider 120. The voltage divider provides a current source bias, VCSB 122, to transistor T2 of the first current source 110. In one embodiment, voltage divider 120 is designed such that the current source bias 122 is halfway between Vcc and Vss $$\left(\text{i.e., current source bias} = \frac{|V_{CC} - V_{SS}|}{2} + V_{SS}\right).$$

Transistors T5, T6, T7, T8, and T9 form differential amplifier 130. Differential amplifier 130 receives the first reference voltage 118 and a second reference voltage 138. In one embodiment, the second reference voltage 138 is a GTL reference voltage as described in the Gunning Transceiver Logic (GTL) Low-Level High-Speed Interface Standard for Digital Integrated Circuits set forth in JEDEC Std. No. 8-3 (from JEDEC Council Ballot, JCB-93-11A).

GTL defines minimum high-level and maximum low-level input voltages with respect to reference voltage $V_{REF}$. Input circuitry typically includes a comparator stage operating about a nominal $V_{REF}$ of 0.8 V. Output requirements provide for both an open-drain output stage (requiring external termination) and an active pull-up, active pull-down output stage requiring no external termination. $V_{REF}$ maximum and minimums are defined as ⅔ of a supply (or termination) voltage less 2%. The supply voltage ranges from approximately 1.14 to 1.26. Thus $V_{REF}$ ranges from 0.74 V to 0.82 V. In one embodiment, $V_{REF}$ is generated external to the integrated circuit and provided to the integrated circuit through a pin. In an alternative embodiment, $V_{REF}$ is generated within the integrated circuit. In either embodiment, $V_{REF}$ tracks the supply voltage. Variations of the GTL standard include GTL+which has a nominal $V_{REF}$ of 1.0 V. GTL is described in U.S. Pat. No. 5,023,488.

Differential amplifier 130 generates the first bias compensation signal VPBIASG 190 in accordance with the result of comparing the first and second reference voltages. The first bias compensation signal 190 is coupled to the gate of transistor T1 for feedback control of the first current source 110. As illustrated, the first bias compensation signal is a GTL "p-type" transistor bias compensation signal.

The compensation circuit 100 effectively generates the bias voltage 190 necessary to compensate p-type transistor T1 of the first current source for PVT variations that cause the first voltage reference 118 to vary from the GTL input voltage reference 138. Given that other circuitry on the same die is susceptible to the same PVT variations, the first bias compensation signal, VPBIASG 190, may similarly be applied to control "p-type" current sources in order to achieve operation substantially independent of PVT variations.

Transistors T10 and T11 form the second current source 140. The first bias compensation signal 190 is coupled to the gate of transistor T10 for feedback control of the second current source. The current source bias 122 is applied to transistor T11.

Second current source 140 is coupled to a second load 150. The voltage developed across second load 150 is the second bias compensation signal VNBIASG 196. As illustrated, the second bias compensation signal is a GTL "n-type" transistor bias compensation signal.

In one embodiment, capacitive elements are included in the circuit in order to ensure a high correlation between any power supply noise and the first and second bias compensation signals. These capacitive elements are included to capacitively couple the bias compensation signals to one of Vcc or Vss.

Referring to FIG. 1, transistors T17 and T18 capacitively couple the first and second bias compensation signals to one of Vcc or Vss. In particular, transistor T17 capacitively couples the first bias compensation signal 190 to Vcc. Similarly, transistor T18 capacitively couples the second bias compensation signal 196 to Vss. Transistors T17 and T18 collectively form a first set 180 of low pass filters.

These capacitive elements serve to reduce the frequency response of the compensation circuit so that high frequency noise in the first and second reference signals (118, 138) do not appreciably affect the operation of the compensation circuit. The capacitive elements also tend to reduce the amount of noise present in the first and second bias compensation signals. Finally, the capacitive elements also force the bias compensation signals to track the power supply noise (i.e., the capacitive elements ensure correlation between power supply noise and noise in bias compensation signals). In particular, transistor T17 ensures that the first bias compensation 190 signal tracks Vcc. Transistor T18 ensures that the second bias compensation signal 196 tracks Vss. In an alternative embodiment, no such capacitive elements are included.

In one embodiment, the compensation circuitry provides PVT compensation signals to mixed types of logic. For example, an integrated circuit may include GTL and CMOS logic. Each type of logic will require PVT compensation to ensure optimal performance.

Logic level bias converters 160 and 170 permit compensation circuit 100 to provide PVT bias compensation signals for a second type of logic from the bias compensation signals generated for a first type of logic.

In one embodiment, the first logic level bias converter 160 generates a CMOS "n-type" bias compensation signal 194 from the GTL "p-type" bias compensation signal 190. The second logic level bias converter 170 generates a CMOS "p-type" bias compensation signal 192 from the GTL "n-type" bias compensation signal 196.

Transistors T13 and T14 form the first logic level bias converter 160. Transistor T13 is coupled to Vcc to provide current to diode connected transistor T14. The gate of transistor T13 is biased by the first bias compensation signal 190. Transistor T14 is coupled to transistor T13 and Vss. The voltage developed across T14 serves as a third compensation signal. As illustrated, the third bias compensation signal is a CMOS "n-type" bias compensation signal designated VNBIAS 194.

Transistors T15 and T16 form the second logic level bias converter. Transistor T16 is coupled to Vss to provide current to diode connected transistor T15. The gate of transistor T16 is biased by the second bias compensation signal 196. Transistor T15 is coupled to transistor T16 and Vcc. The voltage developed across T15 serves as a fourth compensation signal. As illustrated, the fourth compensation signal is a CMOS "p-type" bias compensation signal designated VPBIAS 192.

Transistor T19 capacitively couples the third bias compensation signal 194 to Vcc. Transistor T20 capacitively couples the fourth bias compensation signal 192 to Vss. Transistors T19 and T20 collectively form a second set 182 of low pass filters. The presence of these capacitive elements tends to reduce the effects of high frequency noise within the compensation circuitry. The capacitive elements tend to reduce the amount of noise in the third and fourth bias compensation signals. The capacitive coupling also ensures a high correlation between on die power supply noise and the third and fourth compensation signals.

In one embodiment, compensation circuitry 100 comprises metal oxide semiconductor (MOS) transistors. Thus transistors T1, T2, T3, T4, T5, T6, T10, T11, T13, T15, T17, and T19 are PMOS transistors. Transistors T7, T8, T9, T12, T14, T18, and T20 are NMOS transistors. In alternative embodiment, complementary types are used, thus PMOS transistors are substituted for the NMOS transistors and NMOS transistors are substituted for the PMOS transistors. The use of complementary types requires switching Vcc and Vss. In addition, the bias compensation signal pairs (190, 196 and 192, 194) will similarly have their types (i.e., "p", or "n") switched from those illustrated in FIG. 1.

Figure 3:
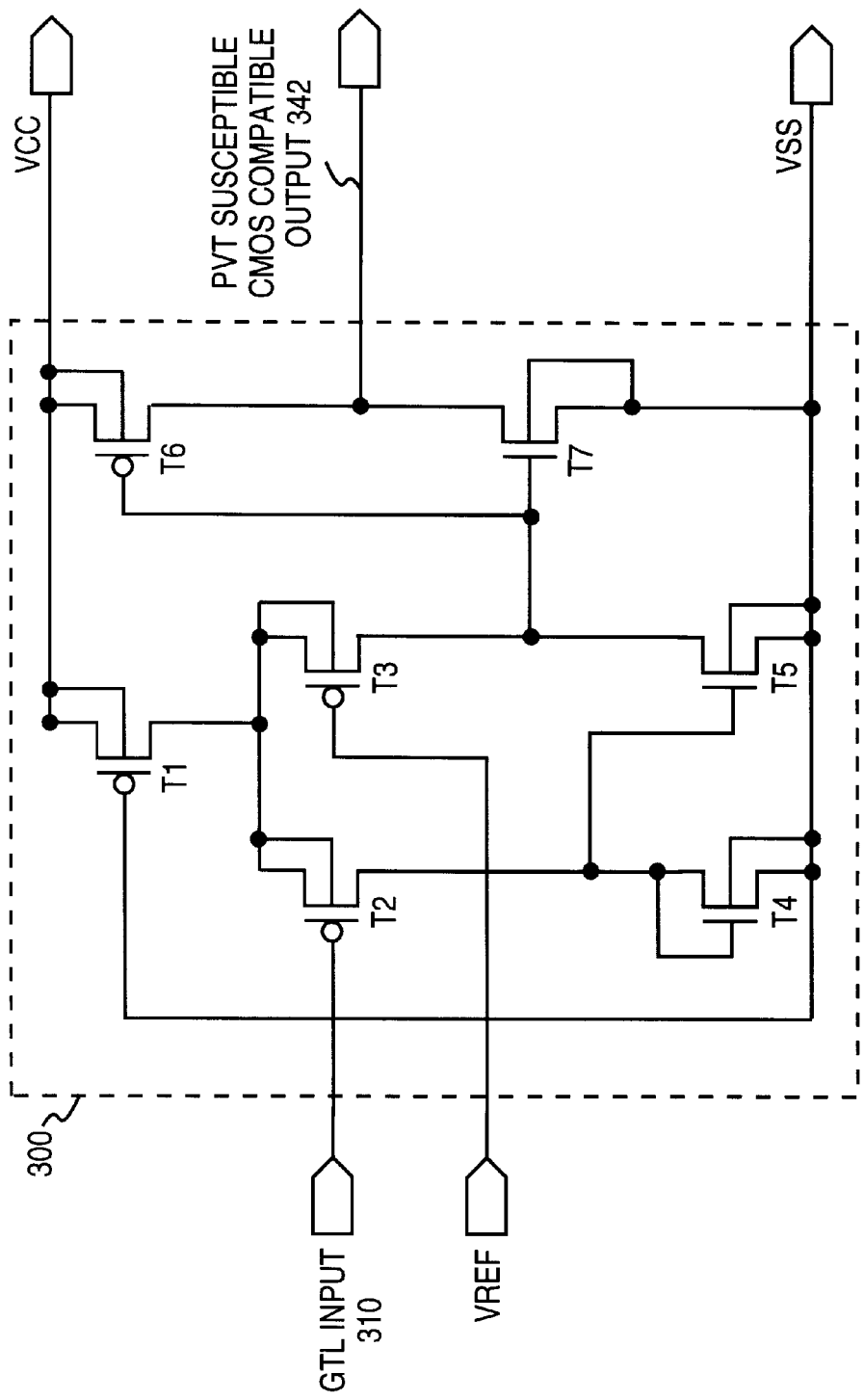
FIG. 3 illustrates a GTL input buffer.

FIG. 3 illustrates a typical GTL input buffer 300. Input buffer 300 is designed to translate a GTL-compatible input signal 310 into a CMOS-compatible signal 342. Input buffer 300 is susceptible to PVT variations.

Figure 4:
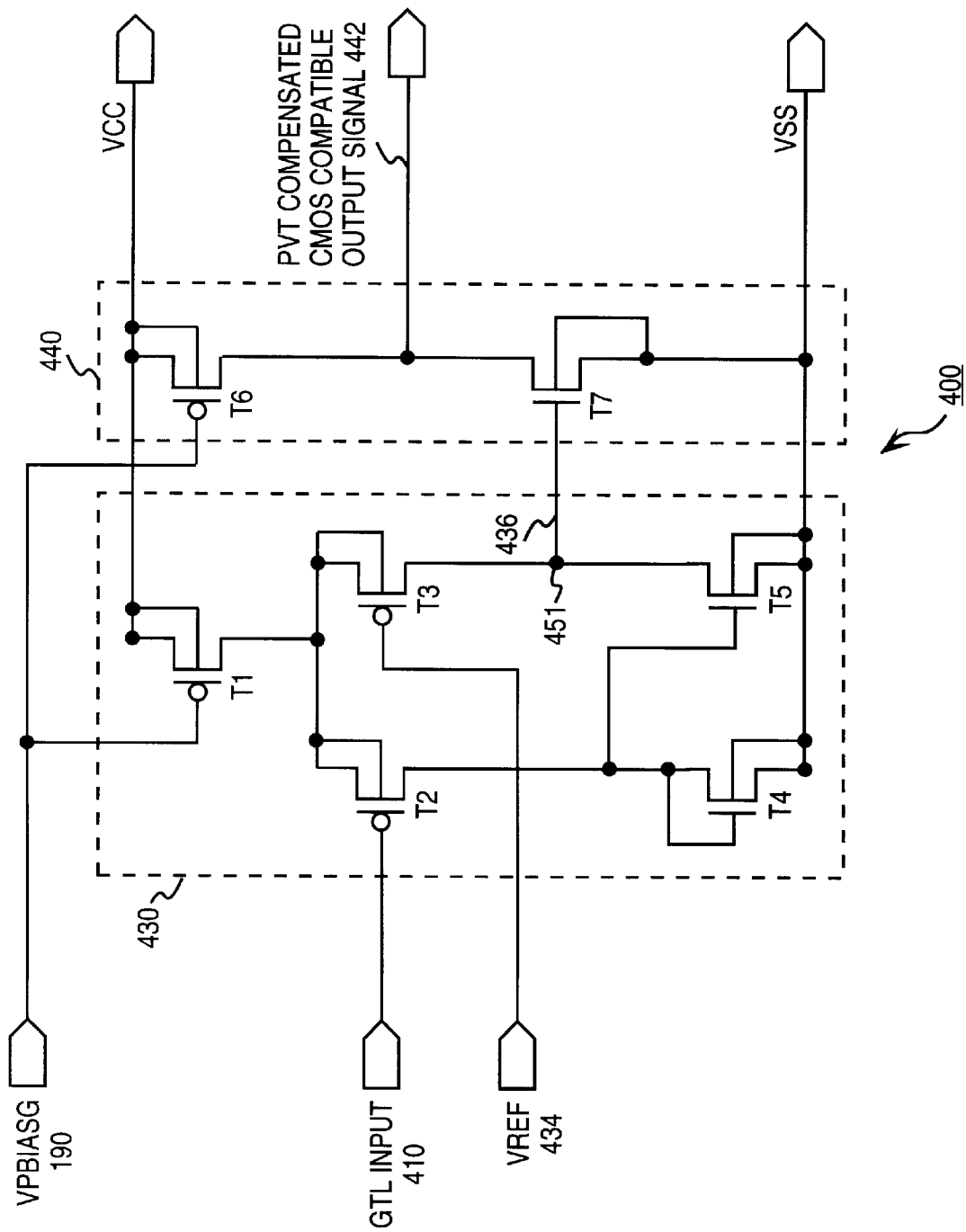
FIG. 4 illustrates a GTL input buffer with PVT bias compensation.

FIG. 4 illustrates GTL input buffer 400. Input buffer 400 translates a GTL-compatible input signal 410 into a CMOS-compatible signal 442. Input buffer 400 is designed to receive an analog PVT bias compensation signal. In particular, bias compensation signals such as VPBIASG 190 of FIG. 1 is applied to the current sources used to control the functioning of GTL input buffer 400.

GTL input buffer 400 includes a differential amplifier 430 and an active gain stage 440. Transistors T1, T2, T3, T4, and T5 form the differential amplifier 430. Transistors T6 and T7 form the active gain stage 440. In one embodiment, GTL input buffer 400 is fabricated within an integrated circuit.

Differential amplifier 430 receives the GTL-compatible input signal 410 and a GTL input reference voltage 434 as previously described. Differential amplifier 430 effectively acts as a comparator to provide an output signal 436 reflecting the relationship between GTL input voltage reference signal 434 and GTL input signal 410. Differential amplifier 430 includes an active current mirror load (T4, T5), differential input devices (T2, T3), and a current source (T1).

The gate of transistor T2 receives the GTL input signal 410. The gate of transistor T3 receives the GTL voltage reference signal 434. The differential input transistors are coupled to the active current load transistors at nodes 450 and 451. Non-inverting output signal 436 is selected from node 451.

Transistor T1 is designed to operate as a current source for differential amplifier 430. Without adequate PVT compensation, T1's operating parameters can drift such that T1 is not operating independently of PVT variations. In the illustrated embodiment, transistor T1 is a p-type transistor. Transistor T1 is therefore biased by PVT compensation signal VPBIASG 190. Given that the compensation circuitry 100 and the input buffer circuitry are fabricated on the same die, the PVT compensation signal VPBIASG 190 causes transistor T1 to behave as a constant current source substantially independent of PVT variations.

The differential amplifier output signal 436 is not fully CMOS compatible. Differential amplifier output signal 436 is provided to active gain stage 440 in order generate CMOS compatible logic levels.

Active gain inverting output stage 440 includes transistors T6 and T7. Transistor T6 acts as a current source. The first bias compensation signal (VPBIASG 190) is coupled to the gate of transistor T6 in order to compensate for fluctuations due to PVT variations. Output signal 436 is coupled to the gate of transistor T7. The resulting input buffer output signal 442 is CMOS compatible. In one embodiment, the output signal 442 is routed to integrated circuit CMOS logic residing on a same die as GTL input buffer 400.

In one embodiment, GTL input buffer 400 comprises metal oxide semiconductor (MOS) transistors. As illustrated, transistors T1, T6, and T7 are PMOS transistors. Transistors T2, T3, T4, and T5 are NMOS transistors.

Figure 5:
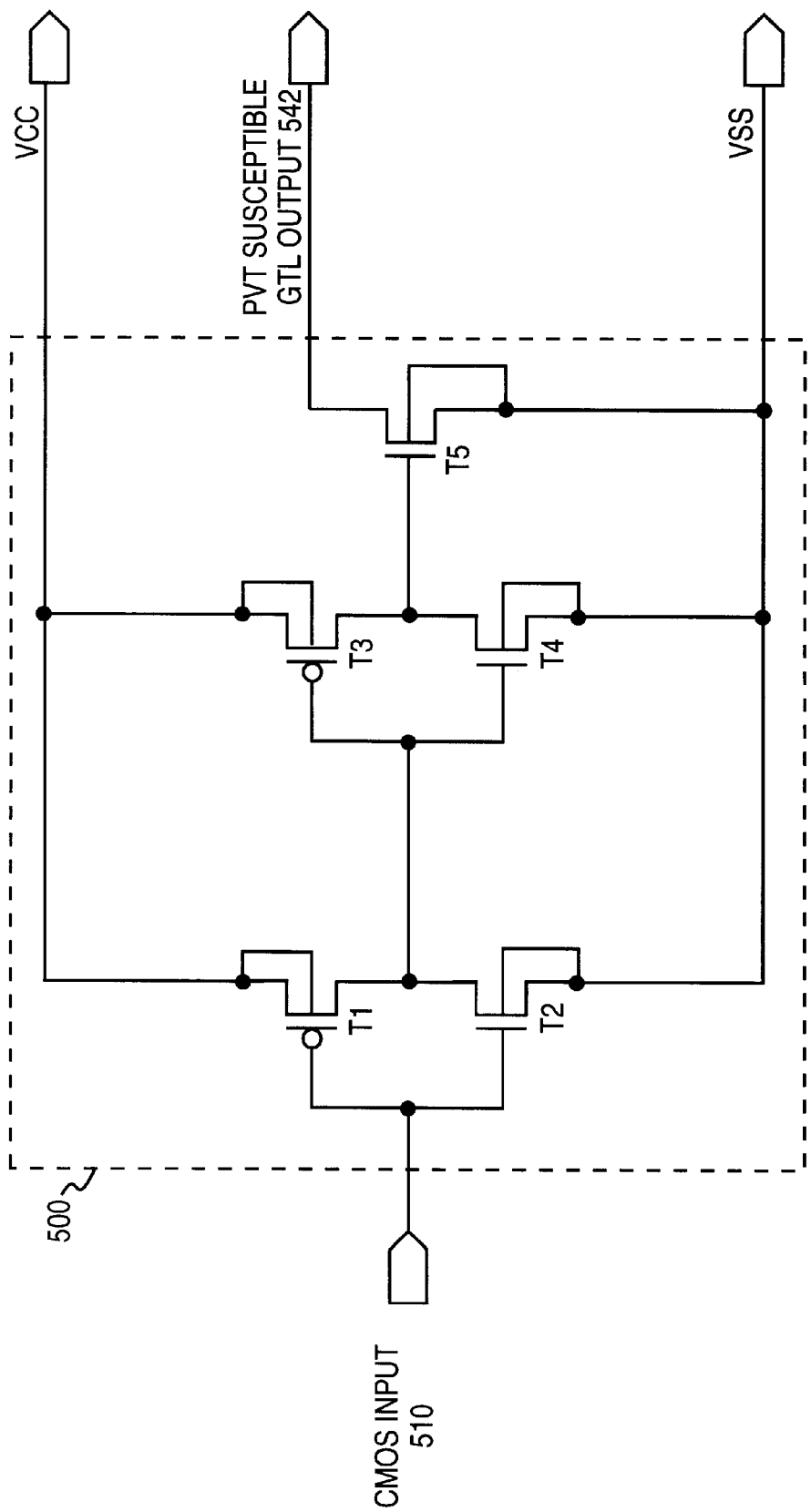
FIG. 5 illustrates a GTL output buffer.

FIG. 5 illustrates a typical GTL output buffer 500. GTL output buffer 500 includes transistors T1, T2, T3, T4, and T5. GTL output buffer 500 receives a CMOS compatible input signal 510 and translates it to a GTL compatible output signal 542. GTL output buffer 500 is susceptible to PVT variations.

Figure 6:
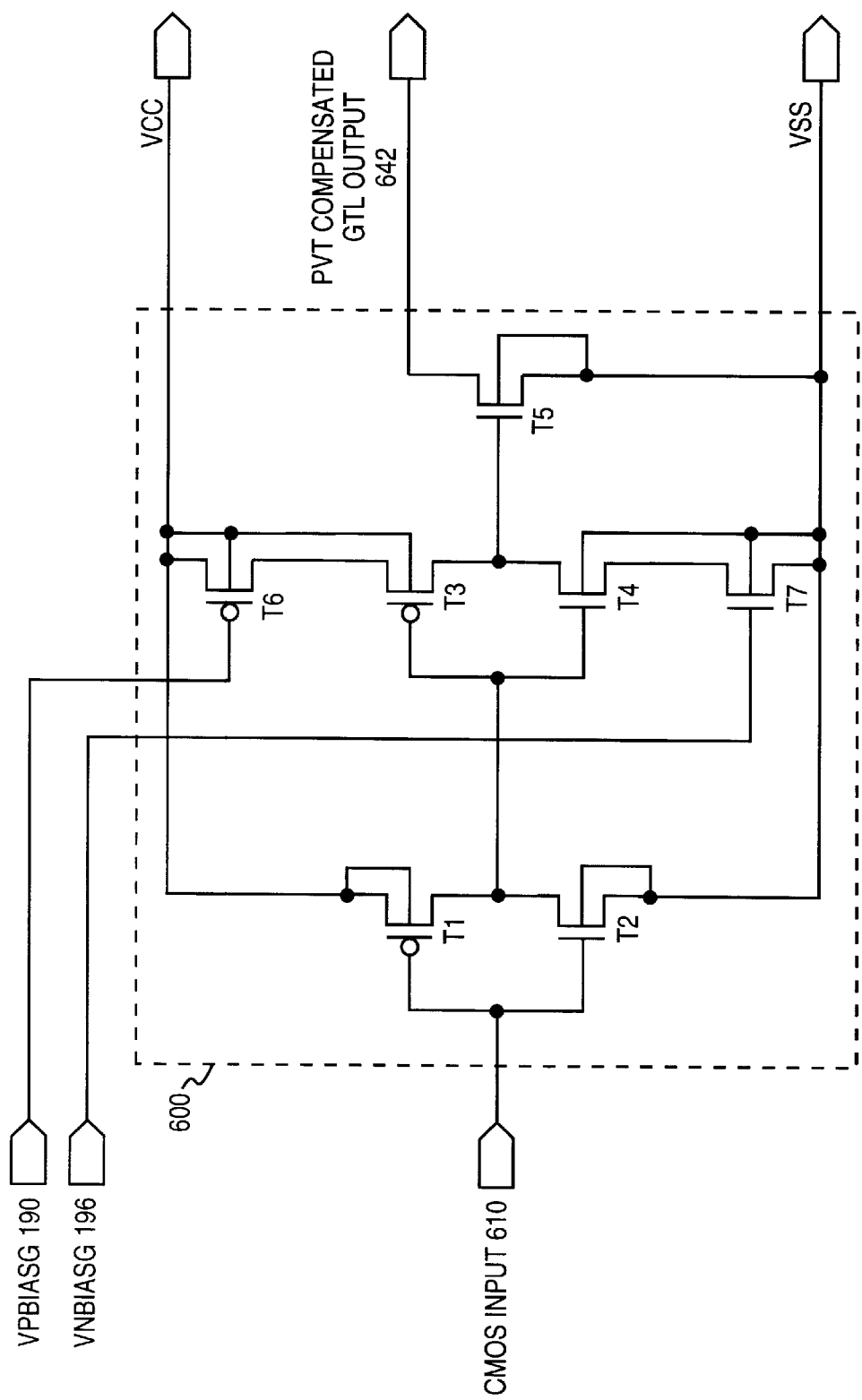
FIG. 6 illustrates a GTL output buffer with PVT bias compensation.

FIG. 6 illustrates a GTL output buffer 600. Output buffer 600 is designed to receive an analog PVT bias compensation signal. Output buffer 600 includes transistors T1, T2, T3, T4, T5, T6, and T7. PVT bias compensation signals VPBIASG 190 and VNBIASG 196 of FIG. 1 are applied to current control devices T6 and T7 in order to produce PVT compensated GTL compatible output signal 642.

Figure 7:
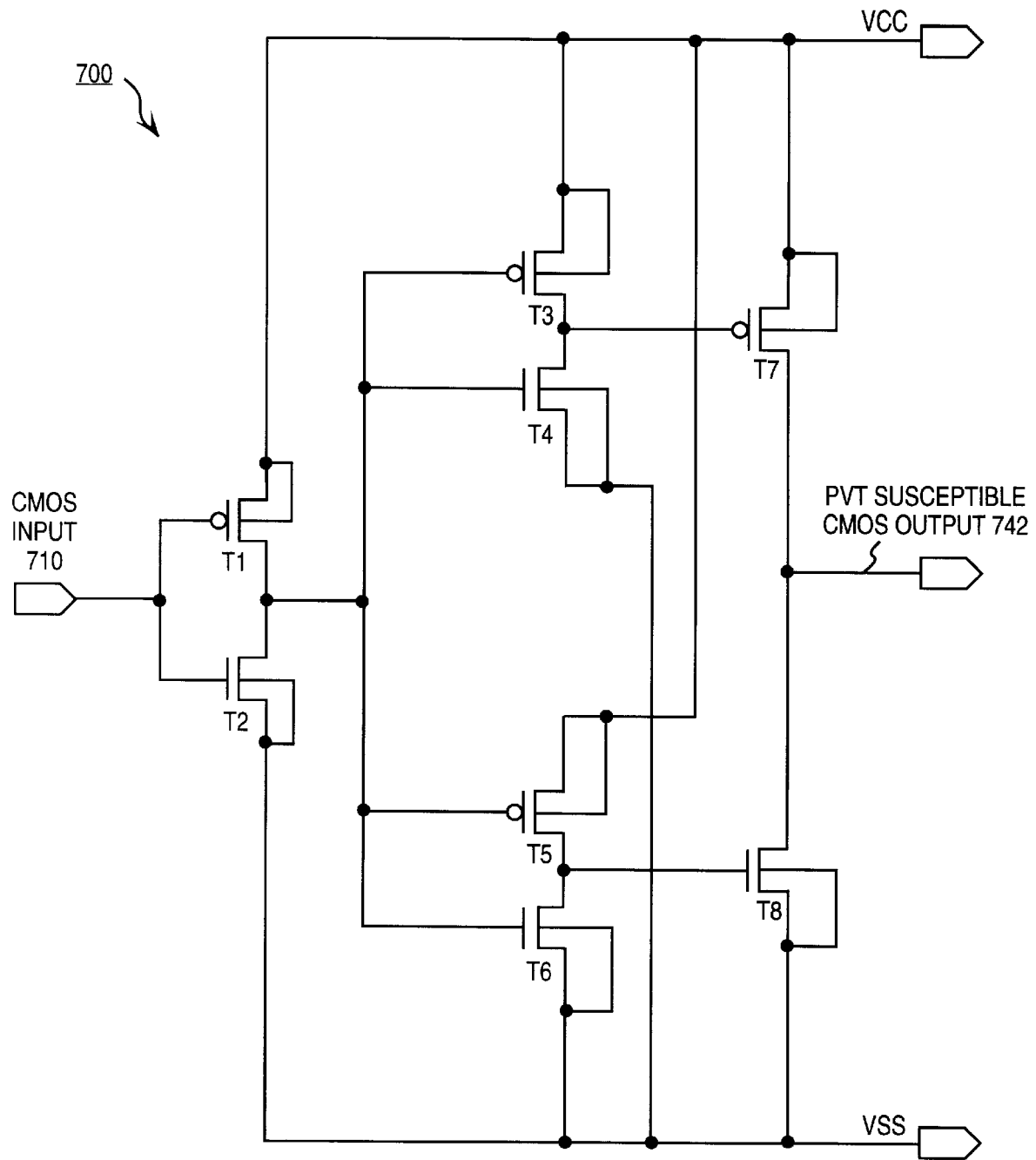
FIG. 7 illustrates a CMOS output buffer.

FIG. 7 illustrates a typical CMOS output buffer 700. CMOS output buffer 700 includes transistors T1, T2, T3, T4, T5, T6, T7, and T8. CMOS output buffer 700 receives a CMOS compatible input signal 710 and provides a buffered CMOS compatible output signal 742. CMOS output buffer 700 is susceptible to PVT variations.

Figure 8:
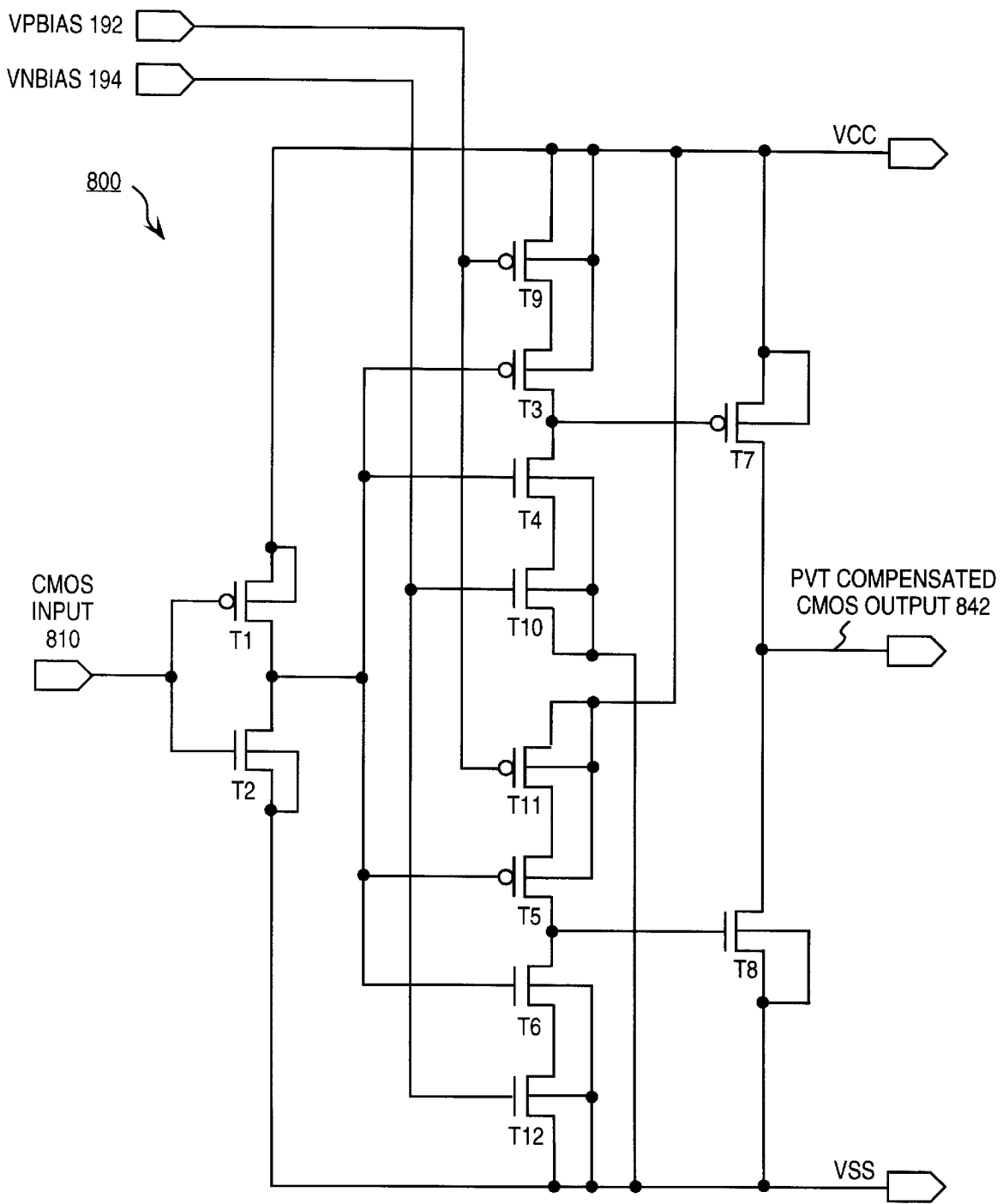
FIG. 8 illustrates a CMOS output buffer with PVT bias compensation.

FIG. 8 illustrates CMOS output buffer 800 with PVT bias compensation. Output buffer 800 is designed to receive analog PVT bias compensation signals. As compared with CMOS output buffer 700, CMOS output buffer 800 includes transistors T9, T10, T11, and T12 for PVT bias compensation.

Referring to FIG. 1, CMOS PVT bias compensation VPBIAS 192 is applied to the gates of PMOS transistors T5 and T9 of FIG. 8. Similarly, CMOS PVT bias compensation VNBIAS 194 is applied to the gates of NMOS transistors T4 and T6 of FIG. 8. In response to input signal 810, CMOS output buffer 800 provides a PVT compensated CMOS output signal 842.

Although the description above was presented with respect to GTL and CMOS logic families, the compensation circuitry 100 can be modified to account for other pairs of logic families (e.g., GTL+, CMOS). With only 20 transistors, compensation circuitry 100 provides PVT compensation bias signal pairs for two logic families. Moreover, the compensation circuitry includes low pass filters to minimize the effect of noise on the compensation circuitry as well as to minimize the amount of noise in the compensation bias signals. If compensation for only one type of logic family is necessary the bias logic level converters (160, 170) and associated capacitive elements (T19, T20) can be eliminated to provide compensation circuitry with even fewer components.

When implementing the analog compensation circuit 100 in an integrated circuit, some of the functional units can be implemented locally. This may be particularly useful in an integrated circuit having mixed logic families. Once VPBIASG 190 is generated, the remaining filters and logic level bias translators (e.g., 160, 170, and 182) may be placed locally. This allows the integrated circuit designer to bus one bias signal (e.g., VPBIASG 190) or perhaps two (i.e., VPBIASG 190, VNBIASG 196) rather than four bias signals around the integrated circuit die.

Thus for example, in one embodiment, the integrated circuit includes a GTL portion and a CMOS portion. The GTL portion includes current source 110, voltage divider 120, differential amplifier 130, second current source 140, second load 150, and filter 180. The CMOS portion includes logic level bias converters 160, 170, and filter 182. VPBIASG 190 and VNBIASG 196 are then bussed to the CMOS portion in order to generate the CMOS bias signals VPBIAS 192, and VNBIAS 194 locally within the CMOS portion. This may be particular useful for an integrated circuit having islands of different logic family types.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:

a first current source coupled to a first node;

a first load coupled to the first current source and a second node to provide a first reference voltage;

a voltage divider coupled between the first and second nodes to provide a current source bias voltage to the first current source; and a differential amplifier coupled to generate a first bias compensation signal as feedback for the first current source in accordance with the difference between the first reference voltage and a second reference voltage.

2. The apparatus of claim 1 wherein the current source bias voltage is approximately halfway between the first and second node potentials.

3. The apparatus of claim 1 wherein the first load is a precision resistor.

4. The apparatus of claim 1 further comprising:

a second current source coupled to the first node, the second current source receiving the current source bias voltage; and a second load coupled to the second current source and the second node to provide a second bias compensation signal.

5. The apparatus of claim 4 further comprising:

a first transistor coupled to the second node, the first transistor biased by the second bias compensation signal; and a diode connected second transistor coupled to the first node, the second transistor coupled to the first transistor at a third node, wherein a third bias compensation signal is generated at the third node.

6. The apparatus of claim 5 further comprising:

a capacitive element coupling the third bias compensation signal to the first node.

7. The apparatus of claim 4 wherein the second load is a diode-connected transistor.

8. The apparatus of claim 4 further comprising:

a capacitive element coupling the second bias compensation signal to the second node.

9. The apparatus of claim 4 wherein each of the first and second current sources comprises:

a first transistor coupled to the first node, the first transistor receiving the first bias compensation signal; and a second transistor coupled to the first transistor, the second transistor receiving the current source bias voltage.

10. The apparatus of claim 1 wherein the differential amplifier is self-biased.

11. The apparatus of claim 1 further comprising:

a capacitive element coupling the first bias compensation signal to the first node.

12. The apparatus of claim 1 further comprising:

a first transistor coupled to the first node, the first transistor biased by the first bias compensation signal; and a diode connected second transistor coupled to the second node, the second transistor coupled to the first transistor at a third node, wherein a third bias compensation signal is generated at the third node.

13. The apparatus of claim 12 further comprising:

a capacitive element coupling the third bias compensation signal to the second node.

14. An apparatus comprising:

a first current source coupled to a first node;

a second current source coupled to the first node;

a first load coupled to the first current source and a second node to provide a first reference voltage;

a voltage divider coupled between the first and second nodes to provide a current source bias voltage to the first and second current sources;

a differential amplifier coupled to generate a first bias compensation signal as feedback for the first and second current sources in accordance with the difference between the first reference voltage and a second reference voltage; and a second load coupled to the second current source and the second node to provide a second bias compensation signal.

15. The apparatus of claim 14 wherein the current source bias voltage is approximately halfway between the first and second node potentials.

16. The apparatus of claim 14 wherein the second load is a diode-connected transistor.

17. The apparatus of claim 14 wherein the first load is a precision resistor.

18. The apparatus of claim 14 wherein the differential amplifier is self-biased.

19. The apparatus of claim 14 further comprising:

a first capacitive element coupling the first bias compensation signal to the first node; and a second capacitive element coupling the second bias compensation signal to the second node.

20. The apparatus of claim 14 wherein each of the first and second current sources comprises:

a first transistor coupled to the first node, the first transistor receiving the first bias compensation signal; and a second transistor coupled to the first transistor, the second transistor receiving the current source bias voltage.

21. The apparatus of claim 14 further comprising:

a first logic level bias converter generating a third bias compensation signal from the first bias compensation signal;

a second logic level bias converter generating a fourth bias compensation signal from the second bias compensation signal, wherein the first and second bias compensation signals are associated with a first type of logic, wherein the third and fourth bias compensation signals are associated with a second type of logic.

22. The apparatus of claim 21 wherein the first type of logic is Gunning Transceiver Logic (GTL).

23. The apparatus of claim 21 wherein the second type of logic is complementary metal oxide semiconductor (CMOS) logic.

24. The apparatus of claim 21 further comprising:
a third capacitive element coupling the third bias compensation signal to the first node; and
a fourth capacitive element coupling the fourth bias compensation signal to the second node.

25. The apparatus of claim 21 wherein the first logic level bias converter further comprises:
a first transistor coupled to the first node; and
a diode-connected second transistor coupled to the first transistor and the second node.

26. The apparatus of claim 21 wherein the second logic level bias converter further comprises:
a first transistor coupled to the second node; and
a diode-connected second transistor coupled to the first transistor and the first node.

* * * * *